United States Patent
Li et al.

(10) Patent No.: US 10,879,736 B2
(45) Date of Patent: Dec. 29, 2020

(54) WIRELESS POWER TRANSFER SYSTEMS AND METHODS USING NON-RESONANT POWER RECEIVER

(71) Applicant: Shenzhen Yichong Wireless Power Technology Co. Ltd., Shenzhen (CN)

(72) Inventors: Tun Li, San Jose, CA (US); Dawei He, Burlingame, CA (US); Siming Pan, San Jose, CA (US); Yihong Dai, Campbell, CA (US); Jingdong Sun, Rolla, MO (US)

(73) Assignee: SHENZHEN YICHONG WIRELESS POWER TECHNOLOGY CO. LTD, Shenzhen (CN)

( * ) Notice: Subject to any disclaimer, the term of this patent is extended or adjusted under 35 U.S.C. 154(b) by 312 days.

(21) Appl. No.: 15/851,926

(22) Filed: Dec. 22, 2017

(65) Prior Publication Data

US 2018/0269718 A1    Sep. 20, 2018

Related U.S. Application Data

(60) Provisional application No. 62/472,339, filed on Mar. 16, 2017.

(51) Int. Cl.
*H02J 50/10*    (2016.01)
*H02J 50/12*    (2016.01)
(Continued)

(52) U.S. Cl.
CPC .......... *H02J 50/10* (2016.02); *H01F 27/2804* (2013.01); *H01F 27/2823* (2013.01);
(Continued)

(58) Field of Classification Search
None
See application file for complete search history.

(56) References Cited

U.S. PATENT DOCUMENTS

| | | | |
|---|---|---|---|
| 2011/0043050 A1* | 2/2011 | Yabe | H04B 5/0087 307/104 |
| 2011/0198940 A1* | 8/2011 | Urano | H01F 38/14 307/104 |

(Continued)

*Primary Examiner* — Jared Fureman
*Assistant Examiner* — Joel Barnett
(74) *Attorney, Agent, or Firm* — Sheppard Mullin Richter & Hampton LLP

(57) ABSTRACT

Methods, systems, and devices for wirelessly providing power to devices using a non-resonant power receiver are disclosed. A transmitter-side inductor may be inductively coupled to a receiver-side inductor. The transmitter-side inductor and one or more transmitter-side matching capacitors may be included in a power transmitter. The receiver-side inductor may be included in a power receiver. The power receiver may not include a receiver-side matching capacitor. Power from the power transmitter may be provided to the power receiver via the inductive coupling between the transmitter-side inductor and the receiver-side inductor. The power receiver may provide a reflected impedance including a real part and an imaginary part to the power transmitter. The transmitter-side matching capacitor(s) may compensate for the imaginary part of the reflected impedance.

18 Claims, 6 Drawing Sheets

(51) Int. Cl.
*H01F 27/28* (2006.01)
*H01F 38/14* (2006.01)
*H03H 7/38* (2006.01)

(52) U.S. Cl.
CPC .............. *H01F 38/14* (2013.01); *H02J 50/12* (2016.02); *H03H 7/38* (2013.01)

(56) References Cited

U.S. PATENT DOCUMENTS

| | | | |
|---|---|---|---|
| 2012/0038220 A1* | 2/2012 | Kim | H02J 7/025 307/104 |
| 2012/0286582 A1* | 11/2012 | Kim | H02J 5/005 307/104 |
| 2016/0056664 A1* | 2/2016 | Partovi | H04B 5/0081 307/104 |

* cited by examiner

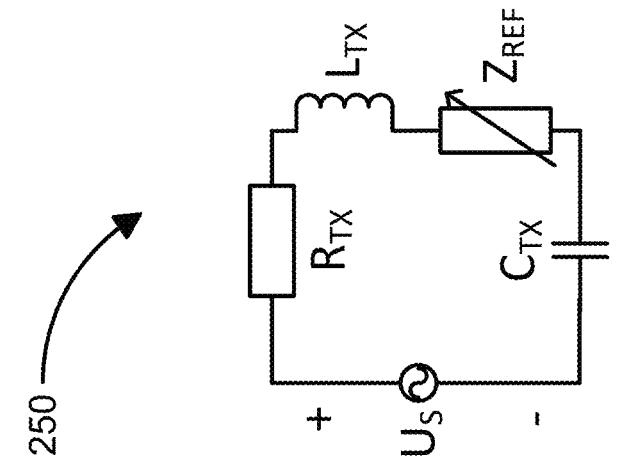
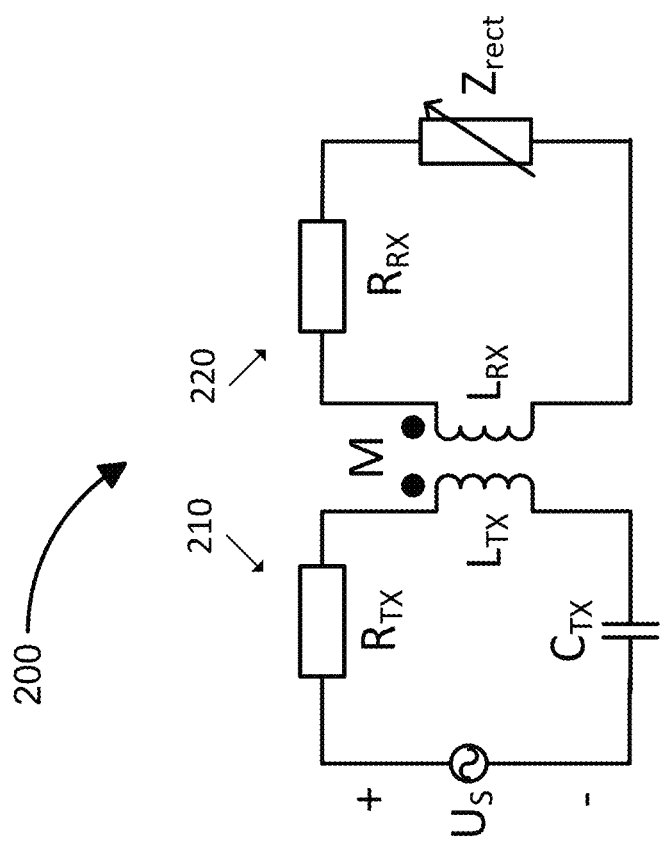
FIG. 2B
FIG. 2A

WIRELESS POWER TRANSFER SYSTEMS AND METHODS USING NON-RESONANT POWER RECEIVER

CROSS-REFERENCE TO RELATED APPLICATIONS

This application claims the benefit of U.S. Provisional Application Ser. No. 62/472,339, filed Mar. 16, 2017, and entitled "WIRELESS POWER TRANSFER SYSTEMS AND METHODS USING NON-RESONANT POWER RECEIVER." The entirety of the aforementioned application is incorporated herein by reference.

TECHNICAL FIELD

The disclosure relates generally to wirelessly providing power to devices, particularly, to a wireless power transfer method and apparatus using a non-resonant power receiver.

BACKGROUND

Wireless power transfer (WPT) technology provides the convenience of wirelessly transferring power to electronic devices (e.g., wirelessly charging electronic devices). In a WPT system, power/energy may be transferred from one or more power transmitter (TX) coils to one or more power receiver (RX) coils through magnetic coupling. An imaginary part of impedance reflected from the power receiver to the power transmitter may downgrade the transfer of power/energy from the power transmitter to the power receiver. In a traditional design, a resonant structure is required for TX coils and RX coils to reduce/eliminate the imaginary part of the reflected impedance. The imaginary part of the reflected impedance may be reduced/eliminated by using a transmitter-side matching capacitor and a receiver-side matching capacitor to match the resonant frequencies of the TX and RX coils.

However, the use of a receiver-side matching capacitor in power receivers include a number of disadvantages. First, the sensitivity of resonant frequency to the transmitter-side and receiver-side matching capacitors are high and slight variations of either transmitter-side or receiver-side matching capacitors may shift and cause misalignment of TX and RX resonant frequencies.

Second, power may wirelessly be transferred from the power transmitter to the power receiver only within a narrow frequency band near the resonant frequency. The use of narrow frequency bands may reduce the compatibility of different power receiver devices with the power transmitter. For example, one power receiver designed to work at 100 kHz may not work directly in a different frequency band (e.g., 350 kHz) because the imaginary part of the reflected impedance will be high. While power receivers may be designed to support multiple frequency bands by adding multiple matching capacitors and switching circuit, such additions increase the complexity and costs of the design.

Third, the voltage and temperature ratings for matching capacitors in a WPT system are high due to the high power and AC voltage across the capacitors. This leads to expensive unit price and increased package dimensions for the power receivers. Moreover, the parasitic effect of the receiver-side matching capacitor (e.g., parasitic resistance) may cause heat dissipation, which may potentially damage nearby components (e.g., battery of a mobile device being charged by the power receiver).

SUMMARY

One aspect of the present disclosure is directed to a method for wirelessly providing power to devices. The method may comprise inductively coupling a transmitter-side inductor to a receiver-side inductor, the transmitter-side inductor and one or more transmitter-side matching capacitors included in a power transmitter and the receiver-side inductor included in a power receiver, the power receiver not including a receiver-side matching capacitor; and providing power from the power transmitter to the power receiver via the inductive coupling between the transmitter-side inductor and the receiver-side inductor. The power receiver may provide a reflected impedance to the power transmitter, the reflected impedance including a real part and an imaginary part. The transmitter-side matching capacitor(s) may compensate for the imaginary part of the reflected impedance.

Another aspect of the present disclosure is directed to a system for wirelessly providing power to devices. The system may comprise a power transmitter and a power receiver. The power transmitter may be configured to receive an input power. The power transmitter may include a transmitter-side inductor wirelessly coupled to a receiver-side inductor and one or more transmitter-side matching capacitors. The power receiver may include the receiver-side inductor. The power receiver may not include a receiver-side matching capacitor. The wireless coupling between the transmitter-side inductor and the receiver-side inductor may enable the power transmitter to transmit power to the power receiver. The power receiver may provide a reflected impedance to the power transmitter, the reflected impedance including a real part and an imaginary part. The transmitter-side matching capacitor(s) may compensate for the imaginary part of the reflected impedance.

Another aspect of the present disclosure is directed to a power transmitter for wirelessly providing power to devices. The power transmitter may comprise a transmitter-side inductor wirelessly couplable to a receiver-side inductor, and one or more transmitter-side matching capacitors. The wireless coupling between the transmitter-side inductor and the receiver-side inductor may enable the power transmitter to transmit power to a power receiver including the receiver-side inductor, the power receiver not including a receiver-side matching capacitor. The power receiver may provide a reflected impedance to the power transmitter, the reflected impedance including a real part and an imaginary part. The transmitter-side matching capacitor(s) may compensate for the imaginary part of the reflected impedance.

In some embodiments, the transmitter-side matching capacitor(s) may include one or more fixed capacitors. In some embodiments, the transmitter-side matching capacitor(s) may include one or more variable capacitors. In some embodiments, the transmitter-side matching capacitor(s) may include one or more fixed capacitors and one or more variable capacitors. In some embodiments, the power transmitter may include a controller configured to adjust the capacitance of the transmitter-side matching capacitor(s) to compensate for the imaginary part of the reflected impedance. In some embodiments, controller may be configured to determine the imaginary part of the reflected impedance, and the capacitance of the transmitter-side matching capacitor(s) may be automatically adjusted based on the imaginary part of the reflected impedance.

In some embodiments, the transmitter-side inductor and the receiver-side inductor may be characterized by a mutual inductance that compensates for the lack of the receiver-side matching capacitor in the power receiver. In some embodiments, the transmitter-side inductor may include a Litz wire coil having a square shape. The Litz wire coil may include a turn number of 5, a layer number of 1, an outer diameter of 50 mm, and an inner diameter of 38 mm. In some embodiments, the receiver-side inductor may include a flexible printed circuit board coil having a circular shape. The flexible printed circuit board coil may include a turn number of 5 per layer, a layer number of 2, an outer diameter of 50 mm, and an inner diameter of 31.7 mm. In some embodiments, the power transmitter and the power receiver may operate within one or more frequencies between 100 kHz to 500 kHz.

It is to be understood that the foregoing general description and the following detailed description are exemplary and explanatory only, and are not restrictive of the invention, as claimed.

BRIEF DESCRIPTION OF THE DRAWINGS

Preferred and non-limiting embodiments of the invention may be more readily understood by referring to the accompanying drawings in which:

FIGS. 2A-2B illustrate alternative formulations of the wireless power transfer system shown in FIG. 1, in accordance with various embodiments of the disclosure.

DETAILED DESCRIPTION OF THE EMBODIMENTS

Specific, non-limiting embodiments of the present invention will now be described with reference to the drawings. It should be understood that particular features and aspects of any embodiment disclosed herein may be used and/or combined with particular features and aspects of any other embodiment disclosed herein. It should also be understood that such embodiments are by way of example and are merely illustrative of but a small number of embodiments within the scope of the present invention. Various changes and modifications obvious to one skilled in the art to which the present invention pertains are deemed to be within the spirit, scope and contemplation of the present invention as further defined in the appended claims.

A non-resonant power receiver for wireless power transfer is disclosed. A non-resonant power receiver may not include a receiver-side matching capacitor. Elimination of the receiver-side matching capacitor from the power receiver may overcome the disadvantages of using a resonant power receivers (including receiver-side matching capacitor), such as sensitivity of resonant frequencies to matching capacitors and limitations of narrow resonant frequency band for power transfer. Elimination of the receiver-side matching capacitor from the power receiver may reduce unit cost and package dimensions of the power receiver. Elimination of the receiver-side matching capacitor from the power receiver may enable better control of the power receiver's power dissipation and avoid potential threats/damage to nearby components (e.g., battery of a mobile device being charged by the power receiver).

A WPT system using a non-resonant power receiver may provide power transfer efficiency and output power capability similar to a WPT system using a resonant power receiver. Such efficiency/capability may be provided by tuning the transmitter-side matching capacitor(s) to compensate for the imaginary part of the impedance reflected from the power receiver to the power transmitter. Tuning of the transmitter-side matching capacitor(s) aims to guarantee the power delivery capability of the power transmitter. Increasing mutual inductance between the transmitter-side inductor and the receiver-side inductor may compensate for the lack of the receiver-side matching capacitor in the power receiver.

Figure 1:
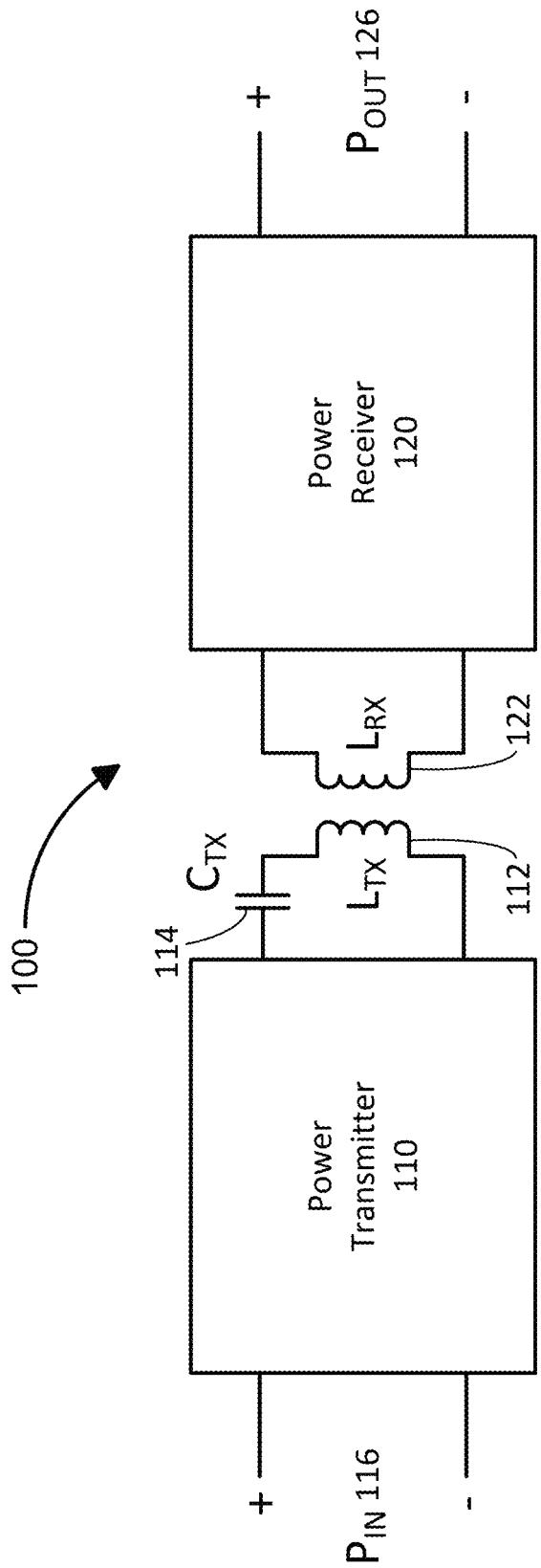
FIG. 1 illustrates an example diagram of a wireless power transfer system, in accordance with various embodiments of the disclosure.

FIG. 1 shows an example wireless power transfer system 100 according some embodiments of the present disclosure. As shown in FIG. 1, the wireless power transfer system 100 includes a power transmitter 110 and a power receiver 120. The power transmitter 110 is configured to receive input power. In some embodiments, the power transmitter 110 may be coupled to and/or may include a power source that provides input power (PIN 116). For example, the power transmitter 110 may be coupled to an electrical output of another device and/or may include an internal power source (e.g., battery, solar panel) that provides input power (PIN 116). The power transmitter 110 includes a transmitter-side inductor 112 and a transmitter-side matching capacitor 114. While a single transmitter-side matching capacitor 114 is shown in FIG. 1, this is merely for reference and is not meant to be limiting. The power transmitter 110 may include one or more transmitter-side matching capacitors 114. The transmitter-side matching capacitor 114 may include one or more variable capacitors and/or one or more fixed capacitors. In some embodiments, the power transmitter 110 may be implemented in a powering device (e.g., charger device). In some embodiments, the power transmitter 110 may be coupled to a powering device (e.g., charger device).

The power receiver 120 includes the receiver-side inductor 122. The power receiver 120 does not include a receiver-side matching capacitor. The power receiver 120 is configured to provide output power ($P_{OUT}$ 126). In some embodiments, the power receiver 120 may be implemented in a consumer electronic device, such as a cell phone, headset, watch, tablet device, laptop, electronic brush, car, or any other consumer electronic devices that may be wirelessly powered (e.g., charged). Alternatively, the power receiver 120 may be implemented as a stand-alone power transfer device for a user to attach a consumer electronic device. Attaching a consumer electronic device to the stand-alone power transfer device may couple the consumer electronic device to the output power (Pour 126) provided by the power receiver 120.

The power transmitter 110 and the power receiver 120 are wirelessly coupled by the transmitter-side inductor 112 and the receiver-side inductor 122. The wireless coupling between the transmitter-side inductor 112 and the receiver-side inductor 122 enables the power transmitter 110 to transmit power to the power receiver 120. The power receiver 120 provides a reflected impedance to the power transmitter 110. The impedance reflected from the power receiver 120 to the power transmitter 110 includes a real part and an imaginary part. The transmitter-side matching capacitor 114 compensates for the imaginary part of the reflected impedance.

FIG. 2A shows a formulation 200 of the wireless power transfer system 100 shown in FIG. 1. The total impedance of the receiver side 220, $Z_{RX}$, includes the load impedance for the rectifier, $Z_{rect}$, the parasitic resistance of the receiver-side coil, $R_{RX}$, and the inductance, $L_{RX}$. The imaginary part of rectifier impedance and the receiver-side coil parasitic resistance in the wireless power transfer system is negligible. Thus, the load impedance for the rectifier, $Z_{rect}$, can be approximated to its real part ($R_{rect}$) and the parasitic resistance of the receiver-side coil, $R_{RX}$, may be ignored. Formulation of $Z_{RX}$ as discussed above is provided below:

$$Z_{RX} = Z_{rect} + R_{RX} + j\omega L_{RX}$$

$$\approx R_{rect} + R_{RX} + j\omega L_{RX} (Z_{rect} \approx R_{rect})$$

$$\approx R_{rect} + j\omega L_{RX} (R_{RX} \approx 0)$$

The receiver side $Z_{RX}$ can be further formulated as a reflected impedance $Z_{ref}$ at the transmitter side 210 through the mutual coupling M between the transmitter-side coil and the receiver-side coil. This formulation 250 is shown in FIG. 2B. The reflected impedance at the transmitter side, $Z_{ref}$, and its real part, $R_{ref}$, are shown below.

$$Z_{ref} = \frac{(\omega M)^2}{R_{rect} + j\omega L_{RX}} = \frac{(\omega M)^2}{R_{rect}^2 + (\omega L_{RX})^2}(R_{rect} - j\omega L_{RX})$$

$$R_{ref} = \text{Real}\{Z_{ref}\} = \frac{(\omega M)^2 R_{rect}}{R_{rect}^2 + (\omega L_{RX})^2} = \frac{(\omega M)^2}{R_{rect} + \frac{(\omega L_{RX})^2}{R_{rect}}}$$

The real part of the reflected impedance, $R_{ref}$, determines the coil-to-coil efficiency of the wireless power transfer system. The total coil-to-coil efficiency is given by below:

$$\eta_{coil-to-coil} = \frac{R_{ref}}{R_{TX} + R_{ref}} \cdot \frac{R_{rect}}{R_{RX} + R_{rect}}$$

$R_{TX}$ is the total parasitic resistance of the transmitter-side coil and the transmitter-side matching capacitor(s). The reflected resistance, $R_{ref}$, is a critical parameter for the coil-to-coil efficiency, with larger reflected resistance providing better coil-to-coil efficiency. Elimination of the receiver-side matching capacitor leads to the existence of the imaginary part $$\frac{(\omega L_{RX})^2}{R_{rect}}$$

in the denominator of the calculation for the reflected resistance, $R_{ref}$, which results in the reflected resistance being smaller than when the power receiver includes a receiver-side matching capacitor.

The efficiency loss caused by the reduction of the reflected resistance, $R_{ref}$, from elimination of the receiver-side matching capacitor may be compensated by using designs for the transmitter-side (TX) and receiver-side (RX) coils that increase the mutual inductance M between the transmitter-side (RX) coil and the receiver-side (RX) coil.

A TX coil and/or RX coil may be designed to achieve a large effective charging area while minimizing the physical dimension of the coil by changing its parameters. The effective charging area refers to the charging area of one single TX/RX coil, where if the center of a RX/TX coil is placed inside of the area, a coil-to-coil efficiency should be no less than a desired value (e.g., a value desired or pre-determined by a user). The effective charging area may be on a horizontal plane that is parallel to the RX coil. For example, the effective charging area may be on the same plane as the RX coil. "Horizontal" may refer to a direction that is parallel to the plane of a TX or RX coil loop, while "vertical" may refer to a direction that is perpendicular to the plane. A radius of the effective charging area may be defined as the horizontal distance between the center of a TX/RX coil (e.g., a vertical projection of the center on the horizontal plane where the effective charging area resides) and the boundary of the effective charging area. In some embodiments, the distance between the TX and RX coils may vary from 0-10 mm. In some embodiments, the distance between the TX and RX coils may vary from 0-7 mm. The parameters of a TX/RX coil may refer to a coil shape, turn number, outer diameter, inner diameter, etc. Based on simulations and experiments, these parameters may be tuned to optimize a coil-to-coil efficiency. A coil-to-coil efficiency refers to the efficiency between a TX coil and a RX coil. It is calculated by the ratio of a RX coil output power (e.g., alternating current (AC) power) over a TX coil input power (e.g., AC power). The loss that affects the coil-to-coil efficiency includes the coil-to-coil loss, the parasitic resistance loss of the matching capacitors, and other losses.

Values of the parameters for an example TX coil design are presented in Table 1. Small variations of the values should be considered as within the scope of the structure and design in this disclosure. Potential variation ranges are also presented in Table 1. The number of turns in a coil loop may be 5. The coil may have a square shape with an outer diameter of 50 mm and an inner diameter of 38 mm. The space between adjacent turns of wires may be 0 mm. The coil may be made of Litz wires. The wires may be made of copper with a trace diameter of 1.15 mm. This particular TX coil design may achieve a uniform effective charging area with no less than 90% of coil-to-coil efficiency within a circular effective charging area, which has a radius of no less than 20 mm. Also at the center of the TX coil, the coil-to-coil efficiency is no less than 95% of peak coil-to-coil efficiency. The peak coil-to-coil efficiency is defined as the coil-to-coil efficiency when the centers of a RX coil and a TX coil are aligned.

TABLE 1

| Parameter | Symbol | Value | Variation Range |
|---|---|---|---|
| Turn Number | N | 5 | 4~6 |
| Coil Shape | / | Square | / |
| Outer Diameter | OD | 50 mm | +−2 mm |
| Inner Diameter | ID | 38 mm | +−2 mm |
| Space between Turns | S | 0 mm | / |
| Coil Type | / | Litz Wire | / |
| Trace Material | / | Copper | Similar Material |
| Trace Diameter | D | 1.15 mm | +−0.15 mm |

In some embodiments, the coil loop may have an outer diameter of 48-52 mm and an inner diameter of 36-40 mm.

The coil loop may include 1-11 turns of wires. The wires may be made of copper with a trace diameter of 1.00-1.30 mm.

Figure 3A:
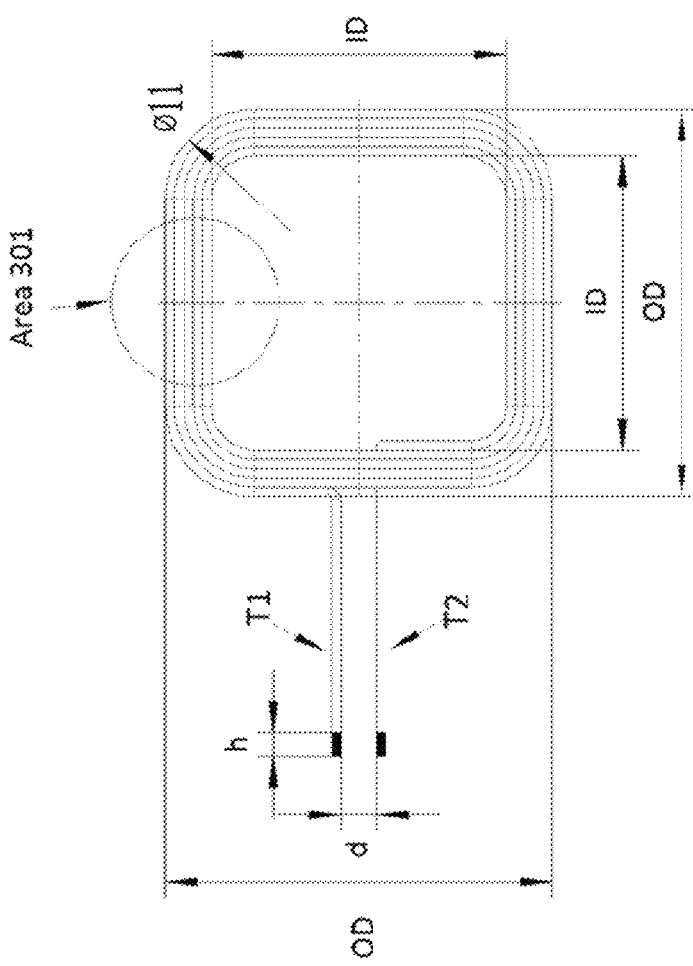
FIGS. 3A-3B are graphical representations illustrating a top view of a transmitter side coil, in accordance with various embodiments of the disclosure.
Figure 3B:
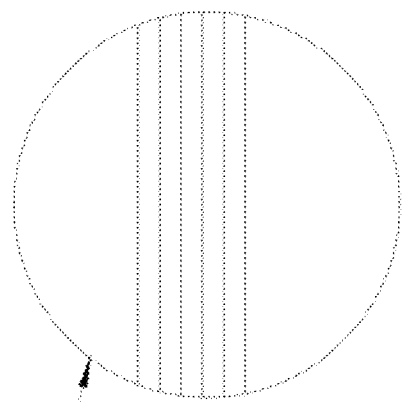

FIG. 3A is a graphical representation illustrating a top view of an example TX coil. As shown in FIG. 3A, wires are wound into a square shaped coil loop, with two extending terminals. The inner diameter of the coil loop is denoted as ID and the outer diameter of the coil loop is denoted as OD. The two terminals with their ends having a length of h (e.g., 3 mm), are separated with a distance of d (e.g., 5 mm). To have a clear view of the coil loop, Area 301 is selected and enlarged in FIG. 3B. In some embodiments, the wires have a trace diameter of D, and the wires are closely wound with no space between the turns. In this example design, the coil loop contains 5 turns of wires.

Figure 3D:
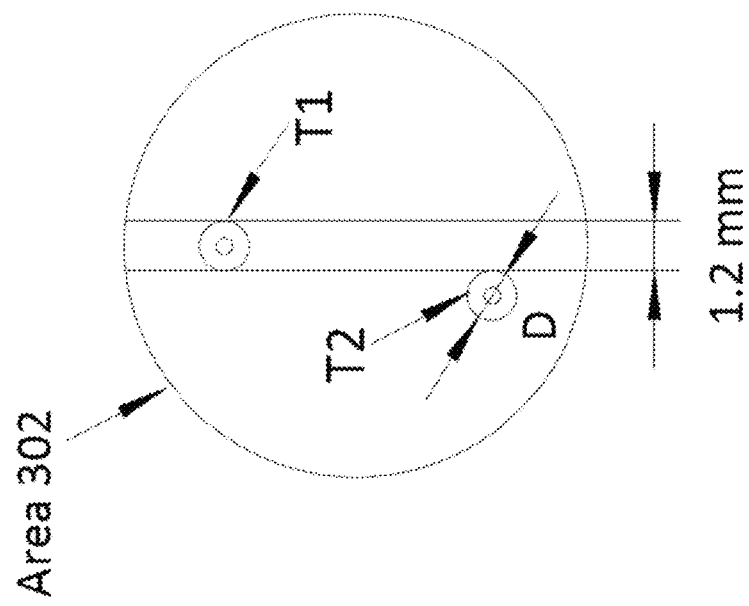
FIGS. 3C-3D are graphical representations illustrating a side view of a transmitter side coil, in accordance with various embodiments of the disclosure.
Figure 3C:
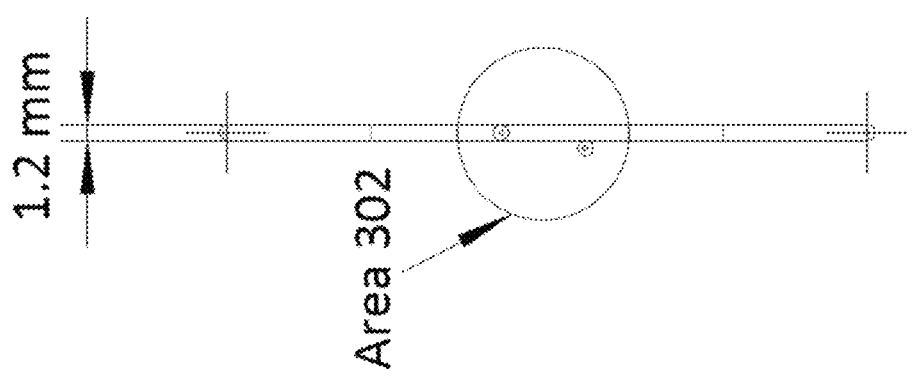

FIG. 3C is a graphical representation illustrating a side view of an example TX coil. The TX coil is viewed from the two terminals towards the coil loop. The two circles represent the cross-sections of the two extending terminals, and the rod-like shape illustrates the side view of the coil loop. As shown in FIG. 3C, the thickness of the coil loop equals to 1.2 mm, which is slightly larger than the trace diameter of the wires (1.15 mm). The wires are closely wound into a coil loop in the same plane. To have a clear view of the locations of the terminals, Area 302 is selected and enlarged in FIG. 3D. Both terminals have a trace diameter of D. One of the terminal (T1) is located in the same plane as the coil loop, and the other terminal (T2) is located closely contacting with the plane.

Figure 3E:
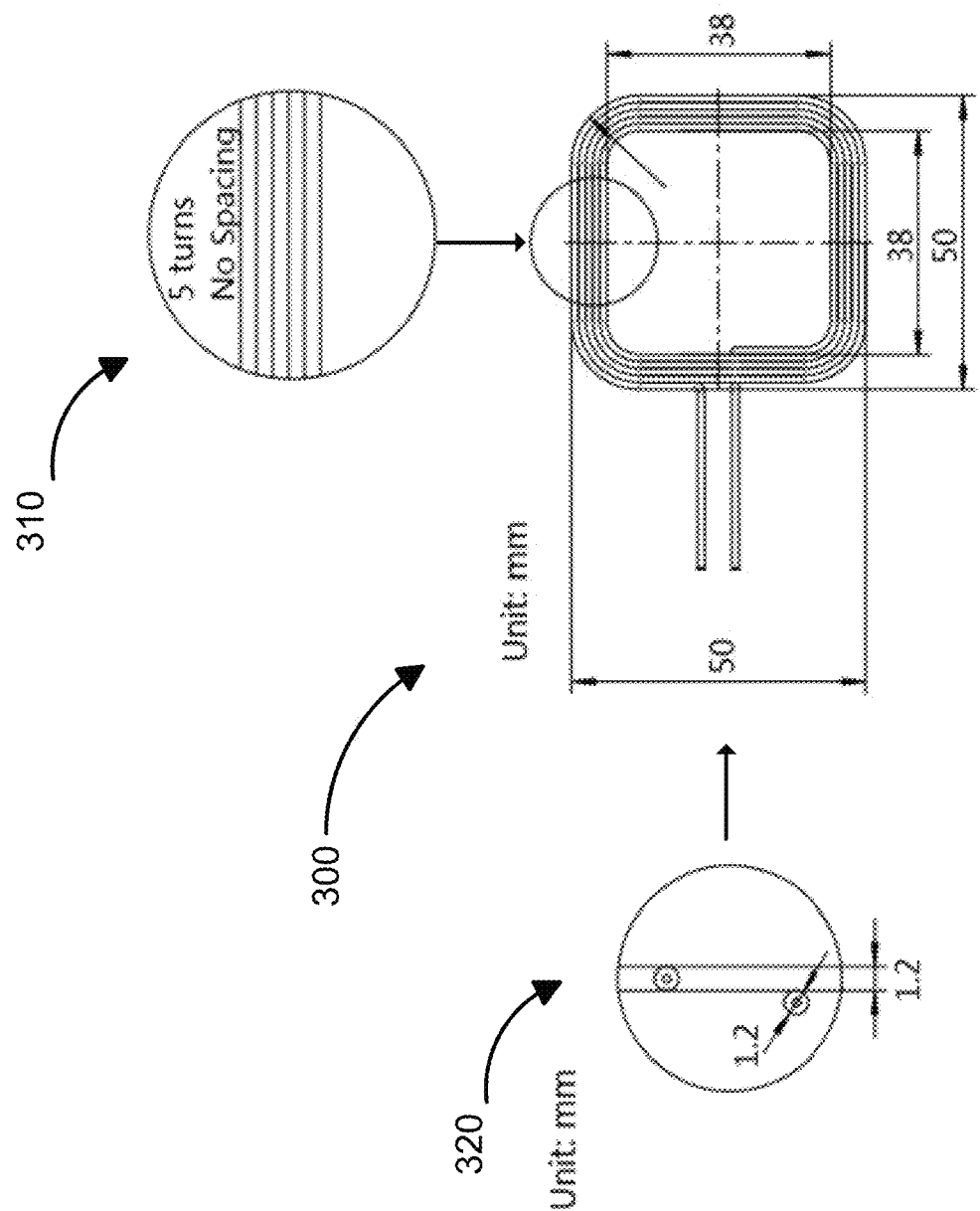
FIG. 3E illustrates an example design of a transmitter-side coil, in accordance with various embodiments of the disclosure.

FIG. 3E shows an example design of a transmitter-side inductor coil 300, according to some embodiments of the present disclosure. The transmitter-side inductor may include a Litz wire coil having a square shape. The Litz wire coil may include a turn number of 5 with no spacing, a layer number of 1, an outer diameter of 50 mm, and an inner diameter of 38 mm. View 310 includes a zoomed view of the turns of the Litz wire coil. View 320 includes a cross-sectional view of the Litz wire coil.

Values of the parameters for an example RX coil design are presented in Table 2. Small variations of the values should be considered as within the scope of the structure and design in this disclosure. Potential variation ranges are also presented in Table 2.

TABLE 2

| Parameter | Symbol | Value | Variation Range |
|---|---|---|---|
| Total Turn Number | N | 10 (all layers) | ±1 |
| Layer Number | / | 2 Layer | 1 Layer |
| Coil Shape | / | Circle | Slightly Elliptical |
| Outer Diameter | OD | 50 mm | ±2 mm |
| Inner Diameter | ID | 31.7 mm | ±2 mm |
| Space between Turns | S | 0.8 mm | ±0.1 mm |
| Coil Type | / | FPCB | / |
| Dielectric Material | / | Polyimide (PI) | Similar Dielectric |
| Dielectric Thickness | H | 0.025 mm | Arbitrary Value |
| Trace Material | / | Copper | Similar Material |
| Trace Thickness | D | 2 oz. (0.0696 mm) | ±0.5 oz. |
| Trace Width | W | 1.0 mm | ±0.2 mm |

Figure 4:
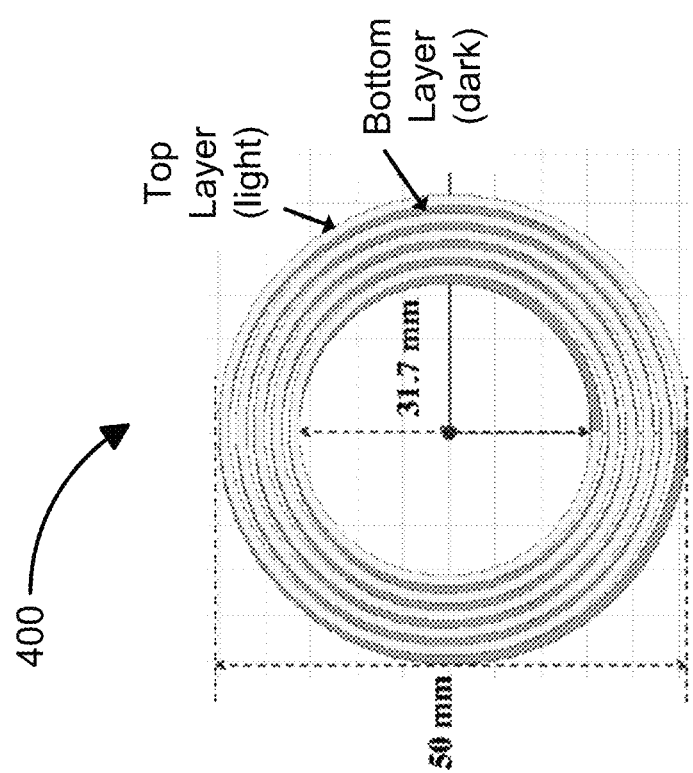
FIG. 4 illustrates an example design of a receiver-side coil, in accordance with various embodiments of the disclosure.

FIG. 4 shows an example design of a receiver-side inductor coil 400, according to some embodiments of the present disclosure. The receiver-side inductor may include a flexible printed circuit board coil having a circular shape. The flexible printed circuit board coil may include a layer number of 2, a turn number of 5 per layer (total turn number of 10), an outer diameter of 50 mm, and an inner diameter of 31.7 mm.

The use of the above TX/RX coil designs may enable the wireless power transfer system of the present disclosure to work within a frequency band of 100 kHz to 500 kHz. Other designs of receiver-side inductor and transmitter-side inductor may be used with the wireless power transfer system of the present disclosure. The designs of the receiver-side inductor and transmitter-side inductor may be varied to vary the frequency band of the wireless power transfer system.

An important aspect of the wireless power transfer system is the output power capability. Elimination of the receiver-side matching capacitor from the power receiver increases the imaginary part of the impedance reflected from the power-receiver. As stated above, the transmitter-side matching capacitor(s) (e.g., 114) may include one or more variable capacitors and/or one or more fixed capacitors. The capacitance of the transmitter-side matching capacitor(s) may be tuned to compensate for the imaginary part of the impedance reflected from the power-receiver. The capacitance of the transmitter-side matching capacitor(s) may be tuned to reduce/eliminate the imaginary part of the impedance reflected from the power-receiver. Tuning of the transmitter-side matching capacitor(s) aims to guarantee the power delivery capability of the power transmitter The capacitance of the transmitter-side matching capacitor(s) is selected such that the transmitter coil is in resonance. The capacitance of the transmitter-side matching capacitor(s) is selected using the following relationship:

$$\omega L_{TX} - \frac{1}{\omega C_{TX}} - \frac{(\omega M)^2 \omega L_{RX}}{R_{rect}^2 + (\omega L_{RX})^2} = 0$$

Which leads to the following calculation of the transmitter-side matching capacitor(s) capacitance:

$$C_{TX} = \frac{1}{\omega} \frac{R_{rect}^2 + (\omega L_{RX})^2}{R_{rect}^2 \omega L_{TX} + (\omega L_{RX})^2 \omega L_{TX} - (\omega M)^2 \omega L_{RX}}$$

The power transmitter of the present disclosure may include a controller/circuitry configured to adjust the capacitance of the transmitter-side matching capacitor(s) to compensate for the imaginary part of the reflected impedance. In some embodiments, the capacitance of the transmitter-side matching capacitor(s) may be manually varied by a user of the power transmitter. For example, the power transmitter may include one or more buttons, switches, and/or other interfaces (digital and/or mechanical) that allow the user to select the working frequency band of the power transmitter and/or provide one or more electrical parameters of the power receiver (e.g., impedance, inductance, etc.). Based on the user input, the power transmitter controller/circuitry may calculate and tune the capacitance of the transmitter-side matching capacitor(s).

In some embodiments, the capacitance of the transmitter-side matching capacitor(s) may be automatically varied by the power transmitter. For example, the power transmitter may include one or more sensors and/or other components to determine the imaginary part of the reflected impedance. Based on the imaginary part of the reflected impedance, the power transmitter controller/circuitry may automatically calculate and tune the capacitance of the transmitter-side matching capacitor(s).

The specification has described methods, apparatus, and systems for wireless power transfer. The illustrated steps are set out to explain the exemplary embodiments shown, and it should be anticipated that ongoing technological development will change the manner in which particular functions are performed. Thus, these examples are presented herein for purposes of illustration, and not limitation. For example, steps or processes disclosed herein are not limited to being performed in the order described, but may be performed in any order, and some steps may be omitted, consistent with the disclosed embodiments. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system for wirelessly providing power to devices, the system comprising:
    a power transmitter configured to receive an input power, the power transmitter including:
       a transmitter-side inductor; and
       one or more transmitter-side matching capacitors; and
    a power receiver including a receiver-side inductor, the power receiver not including a receiver-side matching capacitor;
    wherein:
       wireless coupling between the transmitter-side inductor and the receiver-side inductor enables the power transmitter to transmit power to the power receiver, wherein the power transmitter and the power receiver operate within a frequency band of 100 kHz to 500 kHz;
       the power receiver is configured to provide a reflected impedance to the power transmitter, the reflected impedance including a real part and an imaginary part; and
       the one or more transmitter-side matching capacitors are configured to compensate for the imaginary part of the reflected impedance,
       the transmitter-side inductor includes a Litz wire coil having a square shape, and closely wound with no space between adjacent turns to form a coil loop in a plane, and
       the receiver-side inductor includes a flexible printed circuit board coil having a circular shape, and a space between adjacent turns in a range of 0.7 mm to 0.9 mm.

2. The system of claim 1, wherein the one or more transmitter-side matching capacitors include at least one of a fixed capacitor or a variable capacitor.

3. The system of claim 2, wherein the power transmitter further includes a controller configured to adjust the capacitance of the one or more transmitter-side matching capacitors to compensate for the imaginary part of the reflected impedance.

4. The system of claim 3, wherein the controller is further configured to determine the imaginary part of the reflected impedance, and to automatically adjust the capacitance of the one or more transmitter-side matching capacitors based on the imaginary part of the reflected impedance.

5. The system of claim 1, wherein the transmitter-side inductor and the receiver-side inductor are characterized by a mutual inductance that compensates for the lack of the receiver-side matching capacitor in the power receiver.

6. The system of claim 1, wherein the Litz wire coil has a turn number of 5, a layer number of 1, an outer diameter of 50 mm, and an inner diameter of 38 mm.

7. The system of claim 1, wherein the Litz wire coil includes a first terminal located in the plane of the coil loop, and a second terminal located closely contacting with the plane of the coil loop.

8. The system of claim 1, wherein the flexible printed circuit board coil has a turn number of 5 per layer, and a layer number of 2, an outer diameter of 50 mm, and an inner diameter of 31.7 mm.

9. A power transmitter for wirelessly providing power to devices, the power transmitter comprising:
    a transmitter-side inductor; and
    one or more transmitter-side matching capacitors;
    wherein:
       wireless coupling between the transmitter-side inductor and a receiver-side inductor enables the power transmitter to transmit power to a power receiver including the receiver-side inductor, the power receiver not including a receiver-side matching capacitor, wherein the power transmitter and the power receiver operate within a frequency band of 100 kHz to 500 kHz;
       the power receiver is configured to provide a reflected impedance to the power transmitter, the reflected impedance including a real part and an imaginary part; and
       the one or more transmitter-side matching capacitors are configured to compensate for the imaginary part of the reflected impedance,
       the transmitter-side inductor includes a Litz wire coil having a square shape, and closely wound with no space between adjacent turns to form a coil loop in a plane, and
       the receiver-side inductor includes a flexible printed circuit board coil having a circular shape, and a space between adjacent turns in a range of 0.7 mm to 0.9 mm.

10. The power transmitter of claim 9, wherein the one or more transmitter-side matching capacitors includes at least one of a fixed capacitor or a variable capacitor.

11. The power transmitter of claim 10, wherein the power transmitter further includes a controller configured to adjust the capacitance of the one or more transmitter-side matching capacitors to compensate for the imaginary part of the reflected impedance.

12. The power transmitter of claim 11, wherein the controller is further configured to determine the imaginary part of the reflected impedance, and to automatically adjust the capacitance of the one or more transmitter-side matching capacitors based on the imaginary part of the reflected impedance.

13. The power transmitter of claim 9, wherein the Litz wire coil has a turn number of 5, a layer number of 1, an outer diameter of 50 mm, and an inner diameter of 38 mm.

14. The power transmitter of claim 9, wherein the Litz wire coil includes a first terminal located in the plane of the coil loop, and a second terminal located closely contacting with the plane of the coil loop.

15. A method for wirelessly providing power to devices, the method comprising:

inductively coupling a transmitter-side inductor to a receiver-side inductor, the transmitter-side inductor and one or more transmitter-side matching capacitors included in a power transmitter and the receiver-side inductor included in a power receiver, the power receiver not including a receiver-side matching capacitor; and providing power from the power transmitter to the power receiver via the inductive coupling between the transmitter-side inductor and the receiver-side inductor;

wherein:

the power receiver provides a reflected impedance to the power transmitter, the reflected impedance including a real part and an imaginary part; and the one or more transmitter-side matching capacitors compensate for the imaginary part of the reflected impedance, the power transmitter and the power receiver operate within a frequency band of 100 kHz to 500 kHz, the transmitter-side inductor includes a Litz wire coil having a square shape, and closely wound with no space between adjacent turns to form a coil loop in a plane, and the receiver-side inductor includes a flexible printed circuit board coil having a circular shape, and a space between adjacent turns in a range of 0.7 mm to 0.9 mm.

16. The method of claim 15, wherein the one or more transmitter-side matching capacitors include at least one of a fixed capacitor or a variable capacitor.

17. The method of claim 15, further comprising determining the imaginary part of the reflected impedance.

18. The method of claim 17, further comprising adjusting the capacitance of the one or more transmitter-side matching capacitors to compensate for the imaginary part of the reflected impedance.

* * * * *